US007005678B2

(12) United States Patent
Kumar et al.

(10) Patent No.: US 7,005,678 B2
(45) Date of Patent: Feb. 28, 2006

(54) SILICON CARBIDE SEMICONDUCTOR DEVICE HAVING JUNCTION FIELD EFFECT TRANSISTOR AND METHOD FOR MANUFACTURING THE SAME

(75) Inventors: Rajesh Kumar, Nagoya (JP); Andrei Mihaila, Cambridge (GB); Florin Udrea, Cambridge (GB)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/984,953

(22) Filed: Nov. 10, 2004

(65) Prior Publication Data

US 2005/0151158 A1 Jul. 14, 2005

(30) Foreign Application Priority Data

Nov. 14, 2003 (JP) ............................. 2003-385092

(51) Int. Cl.
*H01L 31/0312* (2006.01)

(52) U.S. Cl. .......................... 257/77; 257/76; 257/133; 257/134; 438/133; 438/136; 438/931

(58) Field of Classification Search ..................... None
See application file for complete search history.

(56) References Cited

U.S. PATENT DOCUMENTS 5,233,215 A 8/1993 Baliga
2003/0096464 A1 * 5/2003 Lanois

* cited by examiner

*Primary Examiner*—Nathan J. Flynn
*Assistant Examiner*—Kevin Quinto
(74) *Attorney, Agent, or Firm*—Posz Law Group, PLC

(57) ABSTRACT

A silicon carbide semiconductor device includes: a semiconductor substrate including a base substrate, a first semiconductor layer, a second semiconductor layer and a third semiconductor layer, which are laminated in this order; a cell portion disposed in the semiconductor substrate and providing an electric part forming portion; and a periphery portion surrounding the cell portion. The periphery portion includes a trench, which penetrates the second and the third semiconductor layers, reaches the first semiconductor layer, and surrounds the cell portion so that the second and the third semiconductor layers are divided by the trench substantially. The periphery portion further includes a fourth semiconductor layer disposed on an inner wall of the trench.

15 Claims, 9 Drawing Sheets

SILICON CARBIDE SEMICONDUCTOR DEVICE HAVING JUNCTION FIELD EFFECT TRANSISTOR AND METHOD FOR MANUFACTURING THE SAME

CROSS REFERENCE TO RELATED APPLICATION

This application is based on Japanese Patent Application No. 2003-385092 filed on Nov. 14, 2003, the disclosure of which is incorporated herein by reference.

FIELD OF THE INVENTION

The present invention relates to a silicon carbide semiconductor device having a junction field effect transistor and a method for manufacturing the same.

BACKGROUND OF THE INVENTION

A semiconductor device in a prior art includes a cell portion, in which a semiconductor device such as a MOSFET (i.e., metal-oxide semiconductor field effect transistor) is formed. The cell portion of the device is disposed at the center of the device so that electric field concentration is dispersed by an outer periphery of the device. Thus, the withstand voltage of the device is increased. In the prior art, a floating field ring as a guard ring is used for the outer periphery of the device to relax the electric field concentration. The guard ring is composed of the end portion of the outer periphery of the device. The guard ring is formed in such a manner that an impurity is implanted from the surface of a semiconductor substrate of the device by an ion implantation method. Then, the implanted impurity is activated by a thermal diffusion method. This method for forming the guard ring is preferably used for a silicon based semiconductor device.

However, it is difficult to increase the withstand voltage of the silicon based semiconductor device. Therefore, a silicon carbide based semiconductor device has been studied to increase the withstand voltage of the device. The silicon carbide crystal has a wide band gap wider than the silicon crystal, a high melting point higher than the silicon crystal, a low dielectric constant, a high breakdown withstand voltage, a high thermal conductivity coefficient, and a high electron mobility. Therefore, it is considered that the performance of the silicon carbide based semiconductor device is higher than the silicon based semiconductor device.

In the prior art, a silicon carbide semiconductor device is disclosed, for example, in U.S. Pat. No. 5,233,215. The device is shown in FIG. 9. The device includes a silicon carbide semiconductor substrate J4. The substrate J4 is composed of an $N^-$ conductive type drift layer J1, a P conductive type layer J2 and an $N^+$ conductive type layer J3, which are laminated in this order. Multiple trenches J5 are formed on the surface of the substrate J4 so that the trench J5 penetrates the P conductive type layer J2 and the $N^+$ conductive type layer J3. In each trench J5, an oxide film J6 is formed so that the inner wall of the trench is covered with the oxide film J6. Then, a metal film J7 is formed on the surface of the oxide film J6. Thus, the trench J5 is embedded with the oxide film J6 and the metal film J7. Thus, the P conductive type layer J2 is divided into multiple portions by the trench J5 so that the guard ring is formed. At the utmost outer periphery of the device, a deep trench J8 is formed. The deep trench J8 is embedded with an oxide film J9 and a metal film J10.

In the above device, electric field generated from the $N^-$ conductive type drift layer J1 is concentrated at the oxide film J6 disposed in the trench J5. Since the withstand voltage of the oxide film J6 is lower than the silicon carbide crystal, the withstand voltage of the device is defined by the oxide film J6 so that the withstand voltage of the device is decreased.

Further, after the trenches J5, J8 are formed, an oxide film forming process and a metal film forming process are necessitated. Furthermore, the deep trench forming process for forming the deep trench J8 at the utmost outer periphery is necessitated. Therefore, a manufacturing method for manufacturing the silicon carbide semiconductor device becomes more complicated.

SUMMARY OF THE INVENTION

In view of the above-described problem, it is an object of the present invention to provide a silicon carbide semiconductor device having a high withstand voltage. It is another object of the present invention to provide a method for manufacturing a silicon carbide semiconductor device, the method having simplified manufacturing process.

A silicon carbide semiconductor device includes: a semiconductor substrate including a base substrate, a first semiconductor layer, a second semiconductor layer and a third semiconductor layer, which are laminated in this order; a cell portion disposed in the semiconductor substrate and providing an electric part forming portion; and a periphery portion surrounding the cell portion. The base substrate has a first conductive type and is made of silicon carbide. The first semiconductor layer is disposed on the base substrate, has the first conductive type, and is made of silicon carbide with a low impurity concentration lower than the base substrate. The second semiconductor layer has a second conductive type and is made of silicon carbide. The third semiconductor layer has the first conductive type and is made of silicon carbide. The periphery portion includes a trench, which penetrates the second and the third semiconductor layers, reaches the first semiconductor layer, and surrounds the cell portion so that the second and the third semiconductor layers are divided by the trench substantially. The periphery portion further includes a fourth semiconductor layer having the first conductive type and disposed on an inner wall of the trench.

In the silicon carbide semiconductor device, the trench and the fourth semiconductor layer disposed in the trench divide the second and the third semiconductor layers so that the second semiconductor layer works as a guard ring. This guard ring improves an insulation withstand voltage of the device, compared with a conventional device having an oxide film disposed on an inner wall of a trench. Thus, the device has the high withstand voltage.

Further, a method for manufacturing a silicon carbide semiconductor device includes the steps of: laminating a first semiconductor layer, a second semiconductor layer and a third semiconductor layer in this order on a base substrate so that a semiconductor substrate is formed; forming a first trench in a cell portion of the semiconductor substrate to penetrate the second and the third semiconductor layers and to reach the first semiconductor layer; forming a second trench in a periphery portion of the semiconductor substrate to penetrate the second and the third semiconductor layers and to reach the first semiconductor layer so that the second trench surrounds the cell portion to divide the second and the third semiconductor layers substantially; forming a channel layer on an inner wall of the first trench by an epitaxial growth method; forming a fourth semiconductor layer on an inner wall of the second trench by an epitaxial growth method together with forming the channel layer; forming a fifth semiconductor layer on the channel layer; forming a gate electrode to connect to at least one of a first and second gate layers, which is provided by the fifth semiconductor layer in the cell portion and the second semiconductor layer in the cell portion, respectively; forming a source electrode to connect to a source layer, which is provided by the third semiconductor layer; and forming a drain electrode on a backside of the base substrate. The periphery portion surrounds the cell portion. The base substrate has a first conductive type and is made of silicon carbide. The first semiconductor layer is disposed on the base substrate, has the first conductive type, and is made of silicon carbide with a low impurity concentration lower than the base substrate. The second semiconductor layer has a second conductive type and is made of silicon carbide. The third semiconductor layer has the first conductive type and is made of silicon carbide. The channel layer has the first conductive type. The fourth semiconductor layer has the first conductive type. The fifth semiconductor layer has the second conductive type.

In the silicon carbide semiconductor device manufactured by the above method, the trench and the fourth semiconductor layer disposed in the trench divide the second and the third semiconductor layers so that the second semiconductor layer works as a guard ring. This guard ring improves an insulation withstand voltage of the device, compared with a conventional device having an oxide film disposed on an inner wall of a trench. Thus, the device has the high withstand voltage.

Further, in the above method for manufacturing the device, the first trench in the cell portion is formed together with the formation of the second trench in the periphery portion. Further, when the channel layer in the cell portion is formed, the fourth semiconductor layer is formed in the second trench at the same time. The second semiconductor layer provides the guard ring. Accordingly, an additional process for forming the guard ring only can be eliminated. Therefore, the process for forming the guard ring combines with the process for forming the J-FET so that the manufacturing process is simplified.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
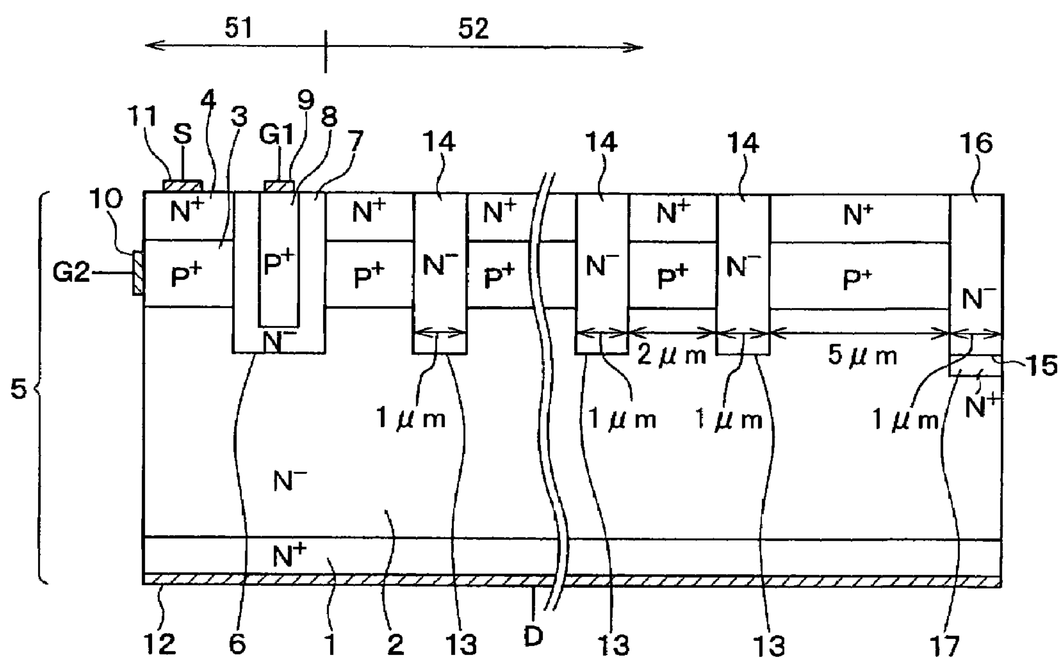
FIG. 1 is a cross sectional view showing a silicon carbide semiconductor device having a J-FET according to a first embodiment of the present invention.

A silicon carbide semiconductor device according to a first embodiment of the present invention is shown in FIG. 1. The device includes an $N^+$ conductive type substrate 1 as a base substrate, an $N^-$ conductive type drift layer 2 as the first semiconductor layer, a $P^+$ conductive type layer 3 as the second semiconductor layer, and an $N^+$ conductive type layer 4 as the third semiconductor layer. The substrate 1 has an impurity concentration equal to or larger than $1\times10^{19}$ $cm^{-3}$. The drift layer 2 has an impurity concentration in a range between $1\times10^{15}$ $cm^{-3}$ and $5\times10^{16}$ $cm^{-3}$. The $P^+$ conductive type layer 3 has an impurity concentration in a range between $1\times10^{18}$ $cm^{-3}$ and $5\times10^{19}$ $cm^{-3}$. The $N^+$ conductive type layer 4 has an impurity concentration in a range between $1\times10^{18}$ $cm^{-3}$ and $5\times10^{20}$ $cm^{-3}$. The $N^+$ conductive type substrate 1, the $N^-$ conductive type drift layer 2, the $P^+$ conductive type layer 3, and the $N^+$ conductive type layer 4 are made of silicon carbide so that they provide a semiconductor substrate 5.

The device includes a cell portion 51 and a periphery portion 52. In the cell portion 51 of the semiconductor substrate 5, multiple J-FETs (i.e., junction field effect transistors) are formed. The periphery portion 52 surrounds the cell portion 51. Thus, the silicon carbide semiconductor device is provided.

In the cell portion as a J-FET forming region, a trench 6 as the first trench is formed on a principal surface of the semiconductor substrate 5. The trench 6 penetrates the $N^+$ conductive type layer 4 and the $P^+$ conductive type layer 3, and reaches the $N^+$ conductive type drift layer 2. The device includes multiple trenches 6 (not shown) so that the trenches 6 are aligned at predetermined intervals. An $N^-$ conductive type epitaxial layer (i.e., an $N^-$ epi-layer) 7 and a $P^+$ conductive type layer 8 as the fifth semiconductor layer are formed on an inner wall of each trench 6 in this order. The $N^-$ epi-layer 7 as the first $N^-$ epi-layer provides a channel layer. The $N^-$ epi-layer 7 has a thickness equal to or thinner than 1 $\mu$m and an impurity concentration in a range between $5\times10^{15}$ $cm^{-3}$ and $5\times10^{16}$ $cm^{-3}$. The $P^+$ conductive type 8 has an impurity concentration in a range between $1\times10^{18}$ $cm^{-3}$ and $5\times10^{20}$ $cm^{-3}$.

In the J-FET, the $P^+$ conductive type layer 8 provides the first gate layer, and the other $P^+$ conductive type layer 3 provides the second gate layer. The $N^+$ conductive type layer 4 provides an $N^+$ conductive type source layer. The device further includes the first gate electrode 9 and the second gate electrode 10. The first gate electrode 9 electrically connects to the $P^+$ conductive type layer 8, and the second gate electrode 10 electrically connects to the $P^+$ conductive type layer 3. Specifically, the first gate electrode 9 is formed on the surface of each $P^+$ conductive type layer 8 as the first gate layer. The first gate electrode 9 is formed of a nickel (i.e., Ni) film and a nickel-aluminum (i.e., Ni—Al) alloy film. The Ni film is capable of contacting a $P^+$ conductive type semiconductor with ohmic contact. The Ni film is formed on the $P^+$ conductive type layer 8, and then, the Ni—AL alloy film is laminated on the Ni film so that the first gate electrode 9 is formed. The second gate electrode 10 is also formed on the surface of the $P^+$ conductive type layer 3 as the second gate layer. The second gate electrode 10 can be actually formed on another sidewall, which is different from a position shown in FIG. 1. Thus, FIG. 1 shows a schematic view of the position of the second gate electrode 10. Specifically, the second gate electrode 10 contacts the $P^+$ conductive type layer 3 through a contact hole, which is formed on the $N^+$ conductive type layer 4 as the source layer.

A source electrode 11 is formed on the surface of the $N^+$ conductive type layer 4. The source electrode 11 is made of, for example, Ni. The source electrode 11 is electrically separated from the first and second gate electrodes 9, 10 with an interlayer insulation film and the like.

A drain electrode 12 is formed on the backside of the semiconductor substrate 5. The drain electrode 12 electrically connects to the $N^+$ conductive type substrate 1. Thus, multiple J-FETs having the above construction are formed in the cell portion 51.

In the periphery portion 52, another trench 13 as the second trench is formed on the principal surface of the semiconductor substrate 5 in such a manner that the trench 13 penetrates the $N^+$ conductive type layer 4 and the $P^+$ conductive type layer 3 and reaches the $N^+$ conductive type drift layer 2. Actually, the device includes multiple trenches 6 (not shown) so that the trenches 13 are aligned at predetermined intervals, for example at 2 $\mu$m intervals. Each trench 13 is embedded with an $N^-$ conductive type epitaxial layer (i.e., an $N^-$ epi-layer) 14 as the fourth semiconductor layer. The $N^-$ epi-layer 14 as the second $N^-$ epi-layer is formed together with the $N^-$ epi-layer 7 at the same time.

The trench 13 provides a guard ring. The depth of the second trench 13 disposed in the periphery portion 52 is almost equal to the first trench 6 disposed in the cell portion 51. The width of the second trench 13 disposed in the periphery portion 52 is narrower than the first trench 6 disposed in the cell portion 51. This is because when the first $N^-$ epi-layer 7 is formed on the inner wall of the first trench 6, the second $N^-$ epi-layer 14 fills the second trench 13 so that the second trench 13 is embedded with the second $N^-$ epi-layer 14 completely. For example, the thickness of the $N^-$ epi-layer 7 is about 0.5 $\mu$m, and the width of the second trench 13 is about 1 $\mu$m. Accordingly, the second trench 13 is embedded with the second $N^-$ epi-layer 14 completely when the first $N^-$ epi-layer 7 is formed on the inner wall of the first trench 6. In this case, the first trench 6 is not embedded with the first $N^-$ epi-layer 7 completely.

Thus, the $P^+$ conductive type layer 3 and the $N^+$ conductive type layer 4 are divided by the second trench 13 and the second $N^-$ epi-layer 14. The cell portion 51 is surrounded by the $P^+$ conductive type layer 3 and the $N^+$ conductive type layer 4, which are disposed between multiple trenches 13. Specifically, the $P^+$ conductive type layer 3 works as the guard ring so that electric field disposed in the periphery portion 52 extend to an outer circumference of the cell portion 51. Thus, the electric field concentration is relaxed, i.e., reduced.

Each $P^+$ conductive type layer 3 and each $N^+$ conductive type layer 4 disposed between the trenches 13 becomes a floating state. Specifically, the $P^+$ conductive type layers 3 and the $N^+$ conductive type layers 4 are not electrically connected to the first and second gate electrodes 9, 10 and the source and the drain electrodes 11, 12.

Further, in the periphery portion 52, the third trench 15 is formed. The third trench 15 is disposed utmost outer portion of the periphery portion 52, which is disposed on the outside of the second trench 13. An $N^-$ conductive type epitaxial layer (i.e., an $N^-$ epi-layer) 16 as the third $N^-$ epi-layer is formed in the third trench 15. An $N^+$ conductive type layer 17 is disposed under the bottom of the third trench 15. The depth of the third trench 15 is almost equal to the first trench 6 disposed in the cell portion 51. Further, the width of the third trench 15 is equal to the second trench 13. A distance between the third trench 15 and the second trench 13 is larger than a distance between the second trenches 13. Specifically, the distance between the third trench 15 and the utmost outer second trench 13 is, for example, 5 $\mu$m. Here, the distance between the second trenches is 2 $\mu$m. The third trench 15 and the $N^-$ conductive type layer 17 provide a channel stopper for an electric field (i.e., a EQR).

In the device having the above construction, the J-FET disposed in the cell portion works with a normally off operation. This operation is controlled by an applied voltage of each of the first and second gate electrodes 9, 10. The operation is described as follows.

In a case where the first gate electrode 9 and the second gate electrode 10 are electrically connected each other so that an electric potential of each electrode 9, 10 is controlled to have the same electric potential, a double gate operation is performed. Further, in a case where the first and second gate electrodes 10 are not electrically connected so that the electric potential of each electrode 9, 10 is controlled independently, the double gate operation is also performed. Specifically, when the device is operated with the double gate operation, an extension of a depletion layer extending from both of the $P^+$ conductive type layers 3, 8 for providing the first and second gate layers is controlled on the basis of the electric potential of each of the first and second gate electrodes 9, 10. For example, when no voltage is applied to the first and second gate electrodes 10, 11, the first $N^-$ epi-layer 7 is pinched off by the depletion layer extending from both of the $P^+$ conductive type layers 3, 8. Thus, a current between a source and a drain of the J-FET turns off, i.e., no current flows between the source and the drain of the J-FET. On the other hand, when a forward bias is applied between the $P^+$ conductive type layers 3, 8 and the $N^-$ epi-layer 7, the extension of the depletion layer extending to the $N^-$ epi-layer 7 becomes smaller. Thus, a channel region is formed in the $N^-$ epi-layer 7 so that a certain current flows between the source and the drain of the J-FET.

In the silicon carbide semiconductor device according to the first embodiment, the trench 13 and the $N^-$ epi-layer 14 disposed in the trench 13 divide the $P^+$ conductive type layer 3 so that the $P^+$ conductive type layer 3 works as the guard ring. This guard ring improves the insulation withstand voltage of the device, compared with a conventional device having an oxide film disposed on an inner wall of a trench. Thus, the device of this embodiment has the high withstand voltage.

Next, a method for manufacturing the device shown in FIG. 1 is described with reference to FIGS. 2A to 3B.

Figure 2A:
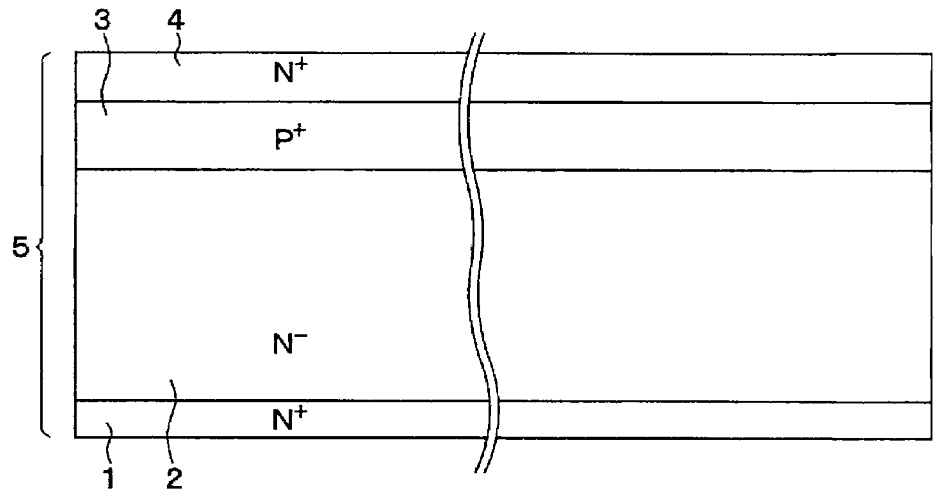
FIGS. 2A and 2B are cross sectional views explaining a method for manufacturing the device according to the first embodiment.

Firstly, the $N^+$ conductive type substrate 1 having a predetermined impurity concentration is prepared. The $N^-$ conductive type drift layer 2, the $P^+$ conductive type layer 3, and the $N^+$ conductive type layer 4 are formed in this order on the principal surface of the substrate 1 by an epitaxial growth method. Thus, as shown in FIG. 2A, the semiconductor substrate 6 is formed.

Figure 2B:
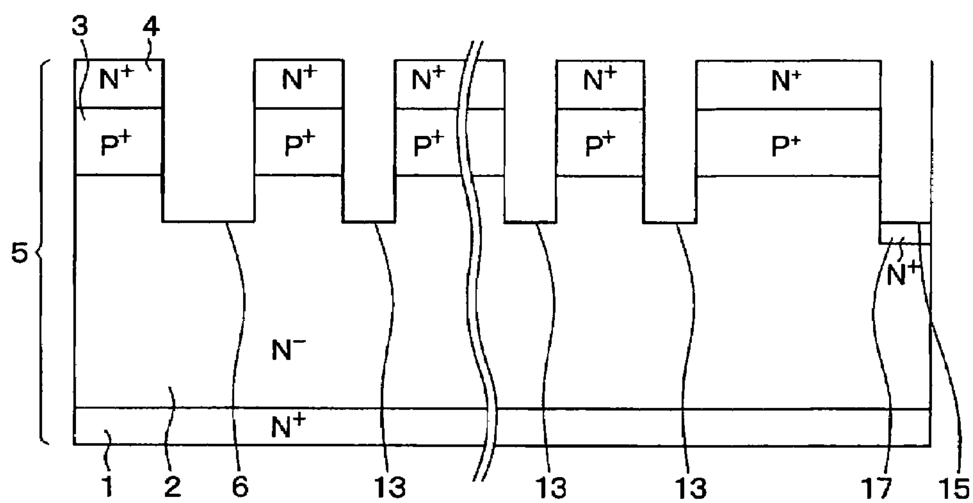

Next, as shown in FIG. 2B, the trench 6 is formed on the surface of the semiconductor substrate 6 in the cell portion 51 to penetrate the $N^+$ conductive type layer 4 and the $P^+$ conductive type layer 3 and to reach the $N^-$ conductive type drift layer 2. Further, both of the trenches 13, 15 are formed on the surface of the semiconductor substrate 6 in the periphery portion 52 to penetrate the $N^+$ conductive type layer 4 and the $P^+$ conductive type layer 3 and to reach the $N^-$ conductive type drift layer 2. Here, the width of the second trench 13 is narrower than the first trench 6. Then, the surface of the semiconductor substrate 5 except for the trench 15 is covered with a metal mask and the like. After that, an N conductive type impurity is implanted on the surface of the substrate 5 by an ion implantation method. Further, the implanted ions are activated so that the $N^+$ conductive type layer 17 is formed under the bottom of the trench 15.

Figure 3A:
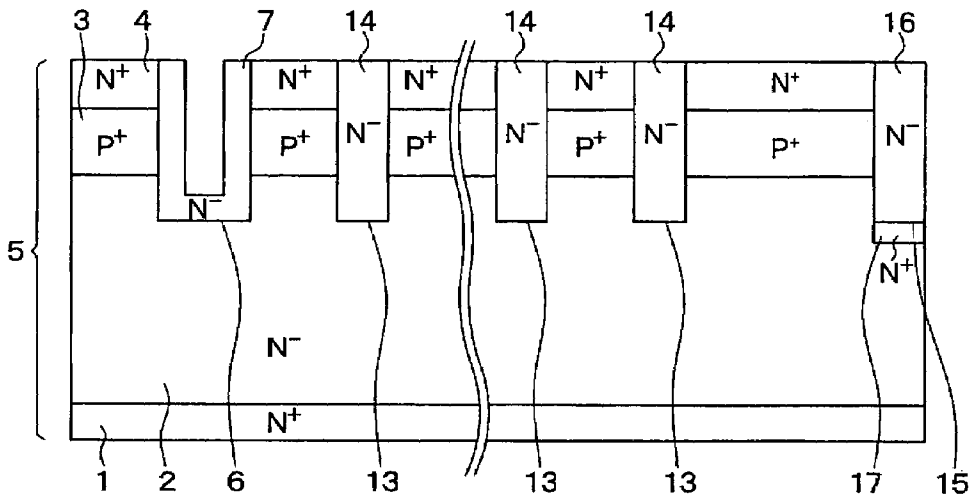
FIGS. 3A and 3B are cross sectional views explaining the method for manufacturing the device according to the first embodiment.
Figure 3B:
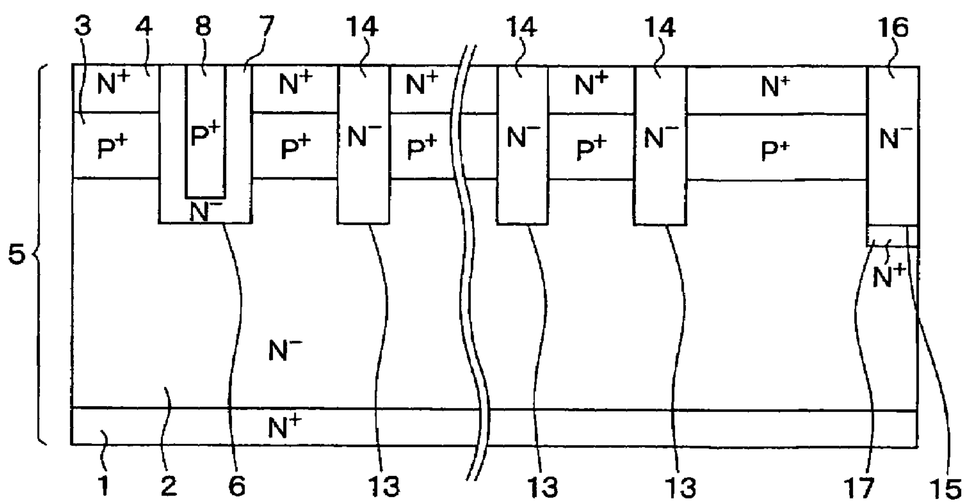

Next, as shown in FIG. 3A, an $N^-$ conductive type epitaxial film is formed on the whole surface of the substrate 5 by the epitaxial growth method. In this case, the thickness of the $N^-$ conductive type epitaxial film is set to be equal to or thicker than a half of the width of the trench 13 so that the trench 13 is embedded with the $N^-$ conductive type epitaxial film completely. However, the trench 6 is partially embedded with the $N^-$ conductive type epitaxial film.

Next, as shown in FIG. 13B, the $P^+$ conductive type epitaxial film is formed on the $N^-$ conductive type epitaxial film by the epitaxial growth method. In this case, the thickness of the $P^+$ conductive type epitaxial film is determined to embed the residual part of the trench 6 with the $P^+$ conductive type epitaxial film, the residual part which is not embedded with the $N^-$ conductive type epitaxial film. Then, the surface of the semiconductor substrate 5 is flattened by an etch-back method and the like. Thus, the $N^-$ epi-layer 7 and the $P^+$ epi-layer 8 are formed in the trench 6. Further, the $N^-$ epi-layers 14, 16 are formed in the trenches 13, 15, respectively.

After that, the interlayer insulation film is formed on the whole surface of the semiconductor substrate 5. Then, the contact hole is formed in the interlayer insulation film and the $N^+$ conductive type layer 4 at a predetermined position. A wiring layer is formed on the interlayer insulation film, and then, the wiring layer is patterned by a photolithography method and the like. Thus, the first and the second gate electrodes 9, 10, and the source electrode 11 are provided. The drain electrode 12 is formed on the backside of the semiconductor substrate 5. Thus, the device is completed.

In the above method for manufacturing the device, the trench 6 in the cell portion 51 is formed together with the formation of the trenches 13, 15 in the periphery portion 52. Further, when the $N^-$ epi-layer 6 in the cell portion 51 is formed, the $N^-$ epi-layers 14, 16 are formed in the trenches 13, 15 at the same time. Thus, the $P^+$ conductive type layer 3 provides the guard ring. Accordingly, an additional process for forming the guard ring only can be eliminated. In this embodiment, the process for forming the guard ring combines with the process for forming the J-FET so that the manufacturing process is simplified.

Although the device includes multiple trenches 13 for dividing the providing $P^+$ conductive type layer 3 as the guard ring, the device can be include at least one part of the $P^+$ conductive type layer 3 for working as the guard ring.

Although the J-FET of the device works with the double gate operation, in which the electric potential of each of the first and second gate electrodes 9, 10 is controlled independently, the device can have other operations. For example, only the electric potential of the first gate electrode 9 is independently controlled, and the electric potential of the second gate electrode 10 is set to be equal to the source electrode 11. In this case, the extension of the depletion layer extending from the $P^+$ conductive type layer 3 to the $N^-$ epi-layer 7 is controlled on the basis of the electric potential of the first gate electrode 9. Thus, the J-FET of the device works with a single gate operation. In this case, the channel region in the $N^-$ epi-layer 7 is defined by the depletion layer extending from the $P^+$ conductive type layer 3. Basically, the single gate operation is similar to the double gate operation.

Further, only the electric potential of the second gate electrode 10 is independently controlled, and the electric potential of the first gate electrode 9 is set to be equal to the source electrode 11. In this case, the extension of the depletion layer extending from the $P^+$ conductive type layer 8 to the $N^-$ epi-layer 7 is controlled on the basis of the electric potential of the second gate electrode 10. Thus, the J-FET of the device works with the single gate operation. In this case, the channel region in the $N^-$ epi-layer 7 is defined by the depletion layer extending from the $P^+$ conductive type layer 8. In this case, basically, the single gate operation is also similar to the double gate operation.

Although the first conductive type is the N conductive type, and the second conductive type is the P conductive type, the first conductive type can be the P conductive type, and the second conductive type can be the N conductive type.

Second Embodiment

Figure 4:
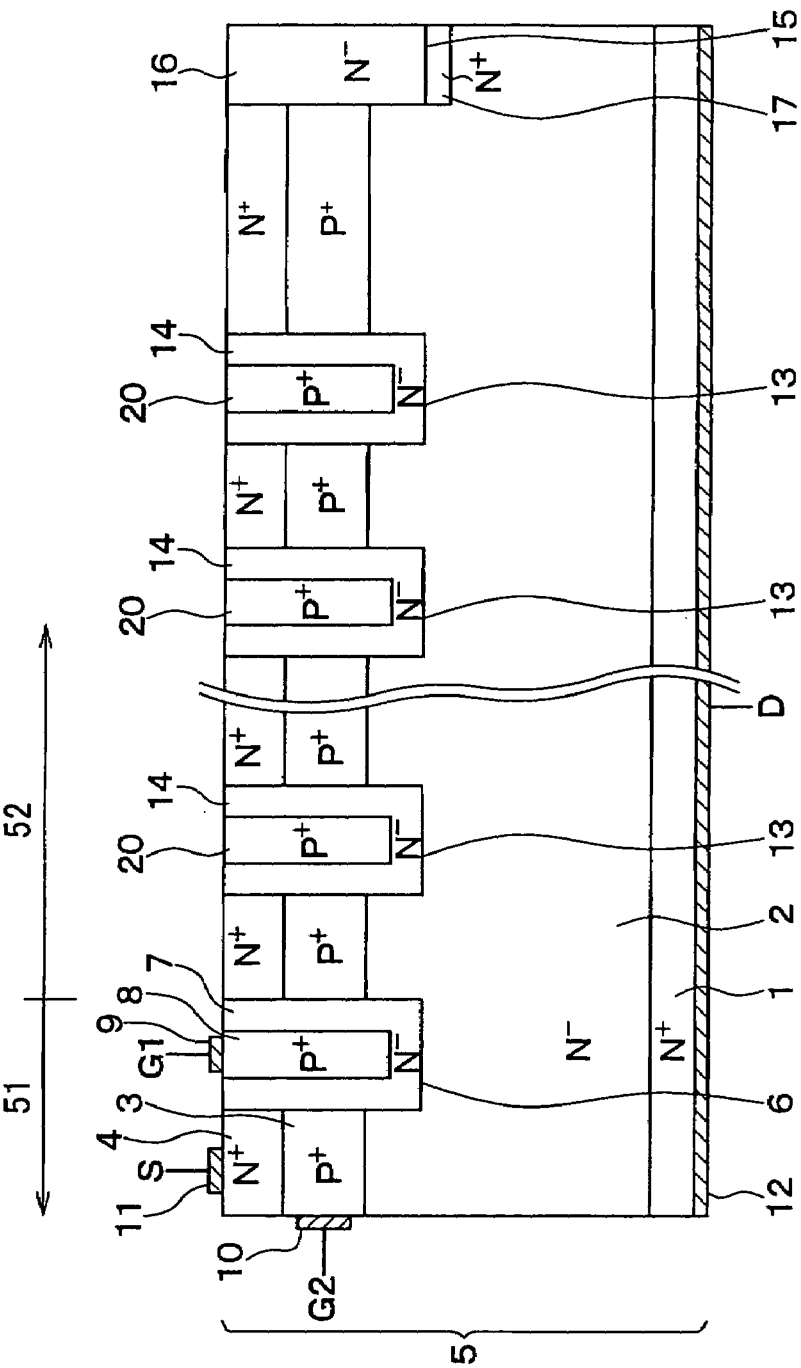
FIG. 4 is a cross sectional view showing a silicon carbide semiconductor device having a J-FET according to a second embodiment of the present invention.

A silicon carbide semiconductor device according to a second embodiment of the present invention is shown in FIG. 4. In the device, the width of the trench 13 in the periphery portion 52 is almost equal to the trench 6 in the cell portion 51. Therefore, the $N^-$ epi-layer 14 and a $P^+$ conductive type layer 20 as the sixth semiconductor layer can be formed in the trench 13. The trench 13 in the periphery portion 52 is embedded with both of the $N^-$ epi-layer 14 and the $P^+$ conductive type layer 20. The $P^+$ conductive type layer 20 is separated by the interlayer insulation film and the like disposed on the surface of the substrate 5 so that the $P^+$ conductive type layer 20 becomes the floating state. Thus, the $P^+$ conductive type layer 20 does not connect to the $P^+$ conductive type layer 8 in the cell portion 51 electrically.

In this case, not only the $P^+$ conductive type layer 3 disposed between the trenches 13 but also the $P^+$ conductive type layer 20 disposed in the trench 13 work as the guard ring. Therefore, even when the construction of the trench 13 in the periphery portion 52 is the same as the trench 6 in the cell portion 51, the device according to the second embodiment has the same effect as the device shown in FIG. 1. Specifically, this guard ring provided by the $P^+$ conductive type layers 3, 20 improves the insulation withstand voltage of the device, so that the device of this embodiment has the high withstand voltage.

Further, the $P^+$ conductive type layer 20 in the periphery portion 52 can be formed together with the $P^+$ conductive type layer 3 in the cell portion 51. Accordingly, an additional process for forming the guard ring only can be eliminated. Thus, the process for forming the guard ring combines with the process for forming the J-FET so that the manufacturing process is simplified.

Figure 5A:
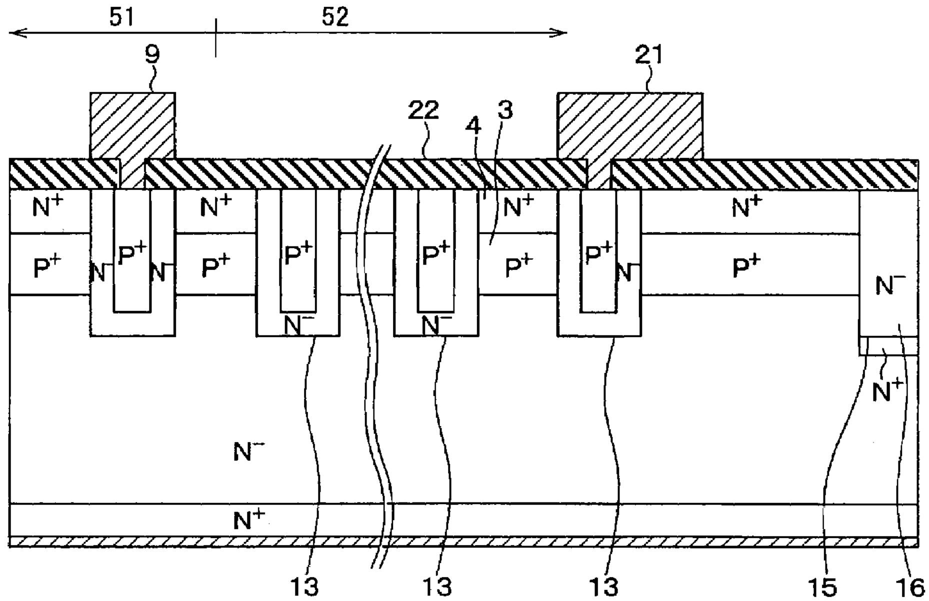
FIGS. 5A and 5B are cross sectional views explaining a connection between a field plate and a guard ring, according to the second embodiment.

In the device, a field plate is formed on the substrate 5 in the periphery portion 52. The construction of the field plate disposed in the periphery portion 52 is, for example, shown in FIGS. 5A or 5B. In FIG. 5A, the field plate as a metal layer 21 electrically contacts the $P^+$ conductive type layer 20 disposed in the utmost outer trench 13. Specifically, the metal layer 21 electrically connects to the $P^+$ conductive type layer 20 through a contact hole formed in an interlayer insulation film 22. Here, the metal layer 21 is formed together with the first and the second gate electrodes 9, 10 and the source electrode 11. For example, after the contact hole is formed at a predetermined position of the interlayer insulation film 22, a metal film as the metal layer 21 is formed and patterned so that the electrodes 9–11 and the metal layer 21 are formed at the same time.

Figure 5B:
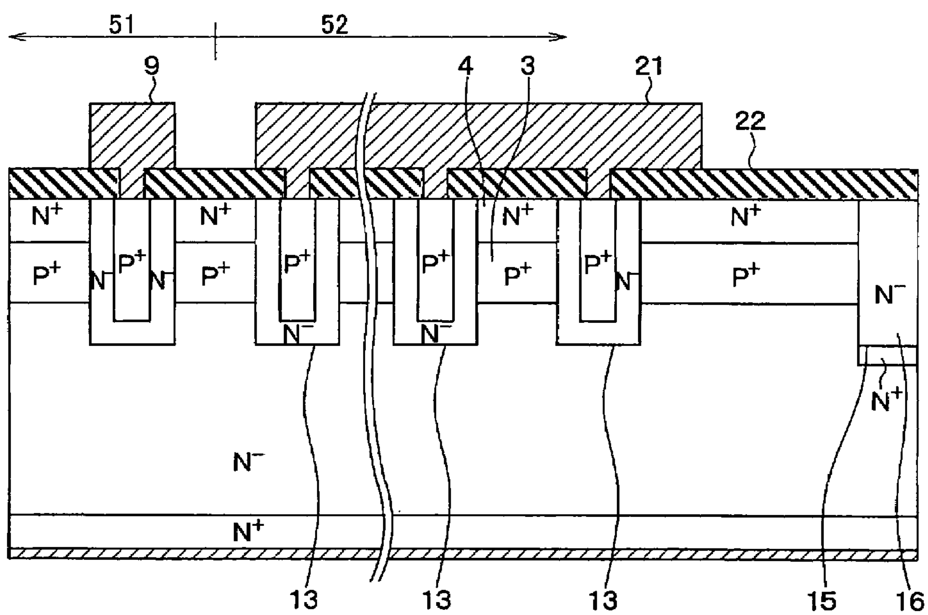

In FIG. 5B, the metal layer 21 as the field plate is electrically connected to the $P^+$ conductive type layer 20 in each trench 13. Specifically, the metal layer 21 electrically connects to each $P^+$ conductive type layer 20 through each contact hole in the interlayer insulation film 22. Here, the contact holes and the metal layer 21 shown in FIG. 5B can be formed by changing a contact hole forming mask in a contact hole forming process and a mask in a metal layer patterning process in the process for manufacturing the device shown in FIG. 5A. Thus, the construction of the guard ring and the field plate can be changed variously.

Third Embodiment

Figure 6:
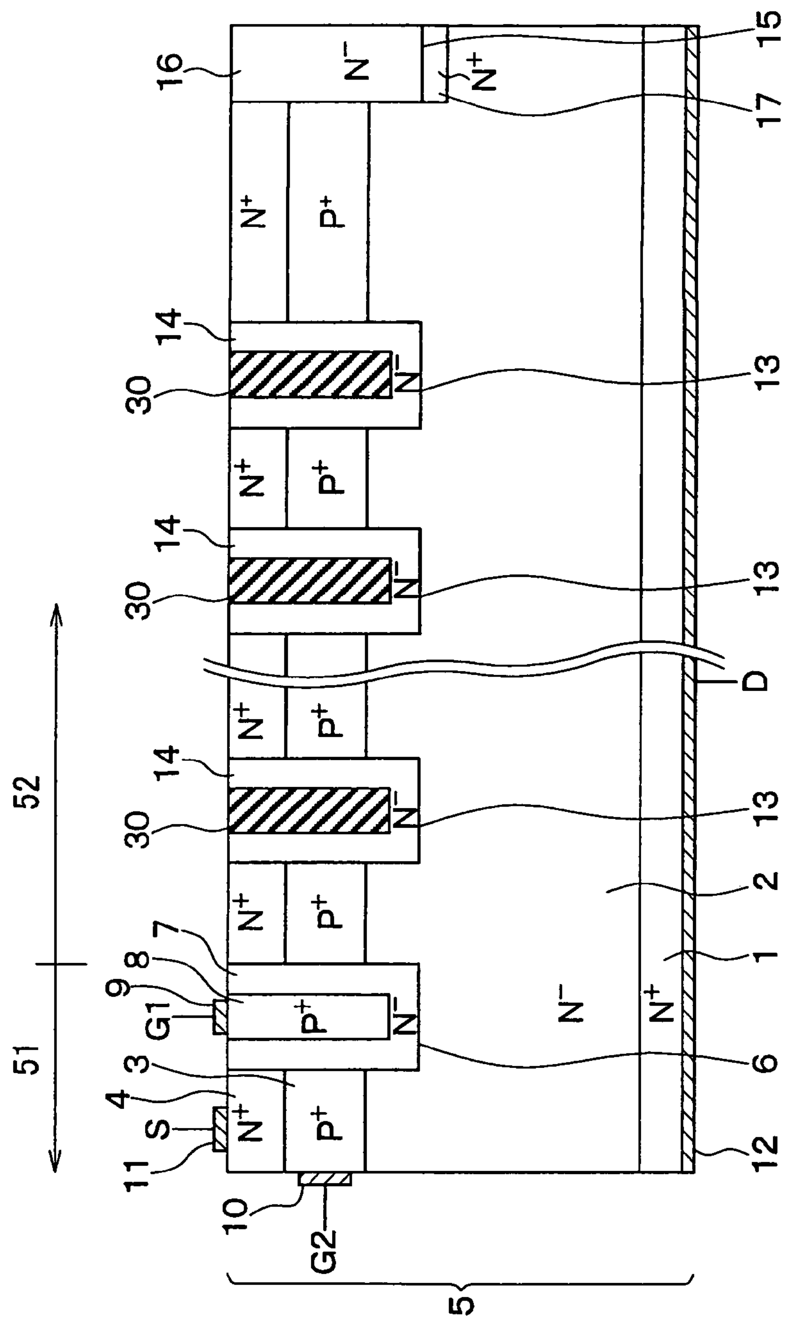
FIG. 6 is a cross sectional view showing a silicon carbide semiconductor device having a J-FET according to a third embodiment of the present invention.

A silicon carbide semiconductor device according to a third embodiment of the present invention is shown in FIG. 6. In the device, the width of the trench 13 in the periphery portion 52 is almost equal to the trench 6 in the cell portion 51. The $N^-$ epi-layer 14 is formed on the inner wall of the trench 13, and an oxide film 30 as an insulation film is formed on the surface of the $N^-$ epi-layer 14. Specifically, the oxide film 30 is formed in the trench through the $N^-$ epi-layer 14 so that the trench 13 is embedded with the oxide film 30 and the $N^-$ epi-layer 14.

In this case, the $P^+$ conductive type layer 3 between the trenches 13 works as the guard ring. The oxide film 30 is formed on the surface of the $N^-$ epi-layer 14 disposed on the inner wall of the trench 13. Therefore, the oxide film 30 is surrounded with the $N^-$ epi-layer 14. Accordingly, the electric field generated from the $N^-$ conductive type drift layer 2 is applied to the oxide film 30 through the $N^-$ epi-layer 14. Therefore, when the impurity concentration of the $N^-$ epi-layer 14 is higher than the $N^-$ conductive type drift layer 2, the electric field concentration of the oxide film 30 is relaxed. Thus, the withstand voltage of the device is increased. Here, the impurity concentration of the $N^-$ epi-layer 14 is set to be equal to or higher than twice the impurity concentration of the $N^-$ conductive type drift layer 2.

Thus, the trench 13 in the periphery portion 52 can be embedded with the $N^-$ conductive type layer 14 and the oxide film 30. The oxide film 30 is formed as follows. After the $N^-$ conductive type layer 14 is formed on the inner wall of the trench 13, there is nothing on the surface of the $N^-$ conductive type layer 14. Therefore, when the $P^+$ conductive type layer 8 is formed in the cell portion 51, the $P^+$ conductive type layer 8 is also formed on the surface of the $N^-$ conductive type layer 14 in the trench 13. Therefore, after the $P^+$ conductive type layer 8 is formed, a part of the $P^+$ conductive type layer 8 disposed on the surface of the $N^-$ conductive type layer 14 in the trench 13 in the periphery portion 52 is removed. Then, the oxide film 30 is formed on the surface of the $N^-$ conductive type layer 14 by, for example, a CVD method (i.e., a chemical vapor deposition method).

Here, an oxide film forming process for forming the oxide film 30 can be combined with a process for forming the interlayer insulation film on the surface of the semiconductor substrate 5. Thus, the manufacturing process can be simplified.

Although the second and the third trenches 13, 15 have predetermined widths, respectively, the trenches 13, 15 can have other widths, respectively. When the width of the trench 13 is set to be wider, for example, wider than the trench 15, the penetration of the electric field penetrating into the oxide film 30 becomes larger than a case where the width of the trench 13 is set to be narrower than the trench 15. Therefore, the electric field concentration is much reduced, compared with the case where the trench 13 is narrow. Thus, the device has much high withstand voltage.

Fourth Embodiment

Figure 7:
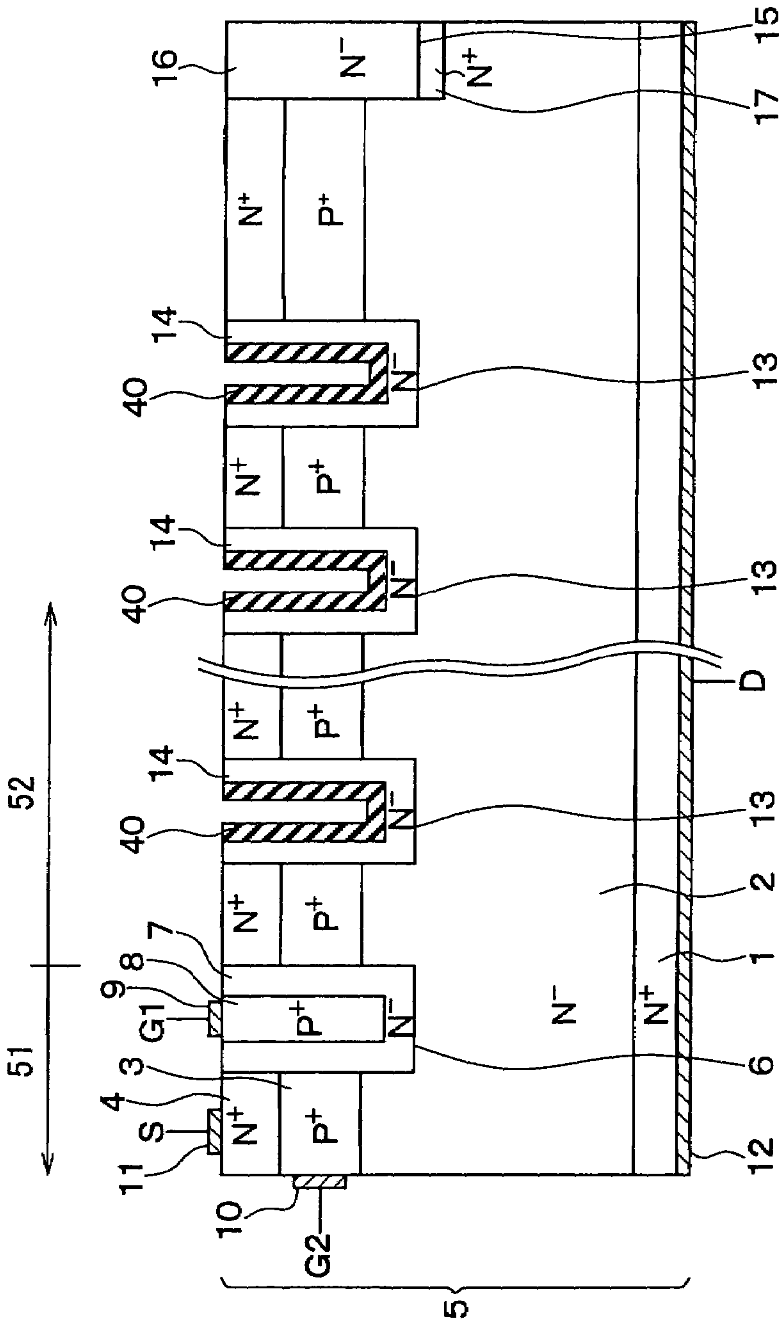
FIG. 7 is a cross sectional view showing a silicon carbide semiconductor device having a J-FET according to a fourth embodiment of the present invention.

A silicon carbide semiconductor device according to a fourth embodiment of the present invention is shown in FIG. 7. In the device, an oxide film 40 as an insulation film is formed on the surface of the $N^-$ conductive type layer 14 in the trench 13 by a thermal oxidation method. The thickness of the oxide film 40 formed by the thermal oxidation method is thinner than that of the oxide film 30 formed by the CVD method. Therefore, the trench 13 is not embedded with the oxide film 40 completely. However, a residual part of the trench, which is not embedded with the oxide film 40, can be embedded with the interlayer insulation film completely.

In this embodiment, when the $P^+$ conductive type layer 8 is formed in the cell portion 51, the $P^+$ conductive type layer 8 is formed on the surface of the $N^-$ conductive type layer 14 in the trench 13. Therefore, after the $P^+$ conductive type layer 8 is formed, a part of the $P^+$ conductive type layer 8 disposed on the surface of the $N^-$ conductive type layer 14 in the trench 13 in the periphery portion 52 is removed. Then, the oxide film 40 is formed on the surface of the $N^-$ conductive type layer 14 by the thermal oxidation method.

In the device, when the impurity concentration of the $N^-$ epi-layer 14 is higher than the $N^-$ conductive type drift layer 2, the electric field concentration of the oxide film 40 is relaxed. Thus, the withstand voltage of the device is increased.

Fifth Embodiment

Figure 8:
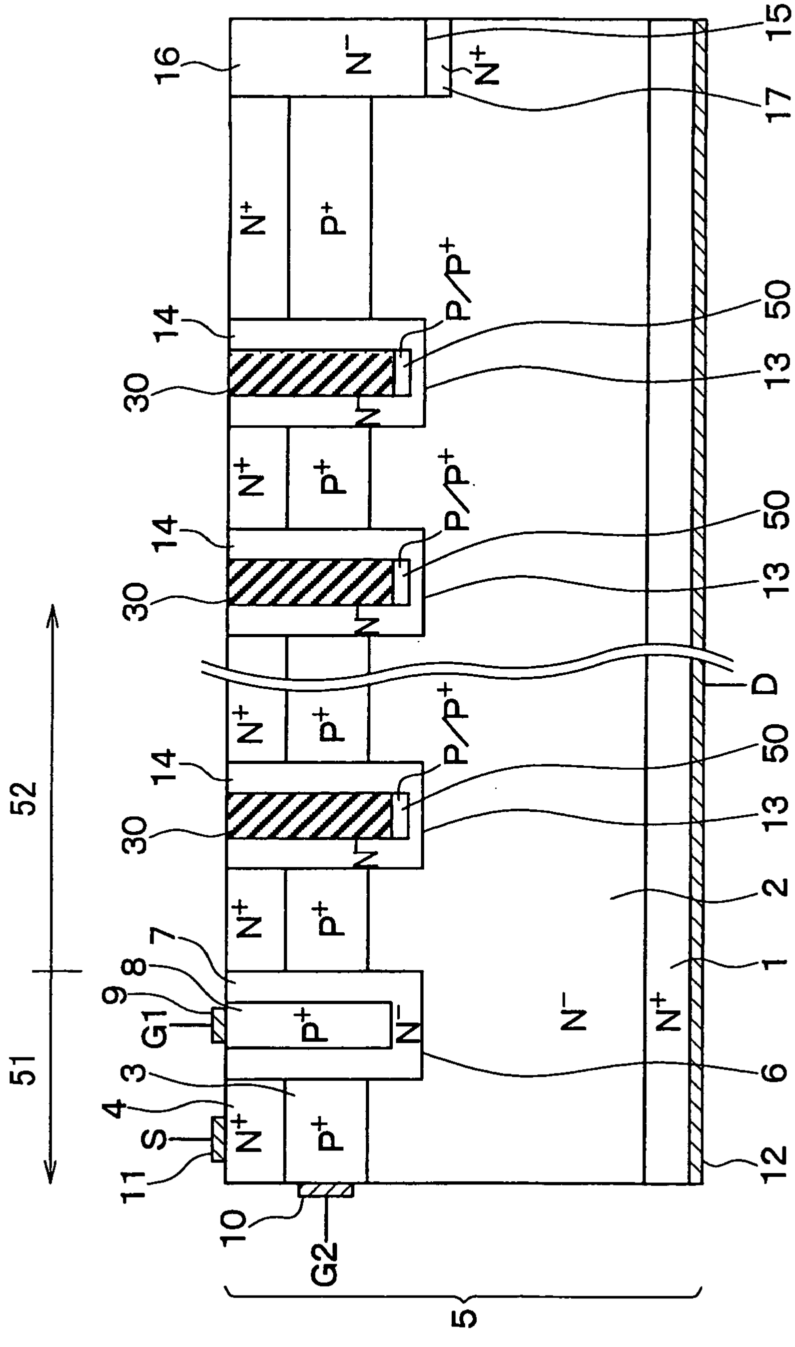
FIG. 8 is a cross sectional view showing a silicon carbide semiconductor device having a J-FET according to a fifth embodiment of the present invention.
Figure 9:
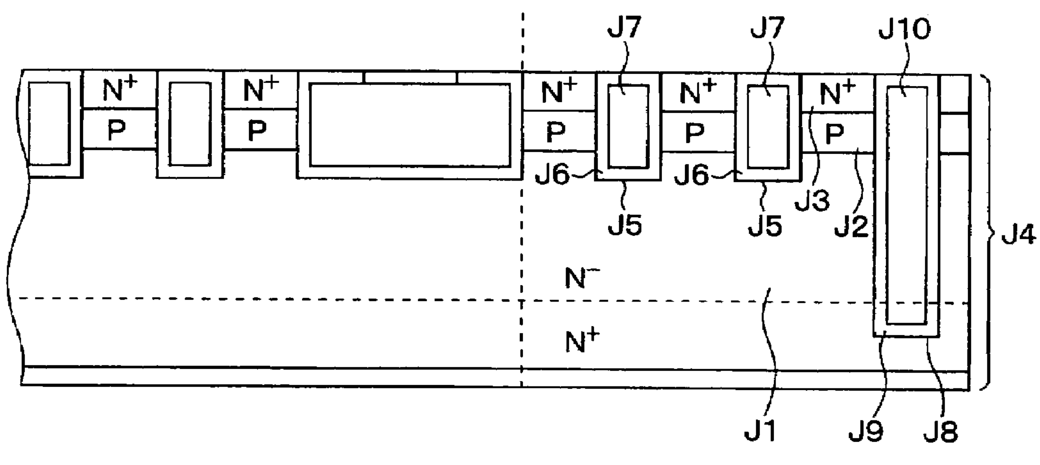
FIG. 9 is a cross sectional view showing a silicon carbide semiconductor device according to a prior art.

A silicon carbide semiconductor device according to a fifth embodiment of the present invention is shown in FIG. 8. In the device, a $P/P^+$ conductive type layer 50 as a buffer layer is formed on the bottom of the trench 13 through the $N^-$ conductive type layer 14. Therefore, the oxide film 30 in the trench 13 is disposed on the $P/P^+$ conductive type layer 50 so that the $P/P^+$ conductive type layer 50 works as the buffer layer.

In this case, not only the $P^+$ conductive type layer 3 disposed between the trenches 13 but also the $P/P^+$ conductive type layer 50 disposed in the trench 13 work as the guard ring. Therefore, even when the construction of the trench 13 in the periphery portion 52 is the same as the trench 6 in the cell portion 51, the device according to the fifth embodiment has the same effect as the device shown in FIG. 1. Specifically, this guard ring provided by the $P^+$ conductive type layers 3, 50 improves the insulation withstand voltage of the device, so that the device of this embodiment has the high withstand voltage. Further, since the depth of the $P/P^+$ conductive type layer 50 is deeper than the $P^+$ conductive type layer 3, the withstand voltage of the device is much increased. Here, the depth of the $P/P^+$ conductive type layer 50 is, for example, in a range between 2 $\mu$m and 3 $\mu$m.

The $P/P^+$ conductive type layer 50 is formed in such a manner that a P conductive type impurity is implanted from the surface of the $N^-$ epi-layer 14 on the bottom of the trench 13 before the oxide film 30 is formed in the trench 13.

Such changes and modifications are to be understood as being within the scope of the present invention as defined by the appended claims.

What is claimed is:

1. A silicon carbide semiconductor device comprising:

a semiconductor substrate including a base substrate, a first semiconductor layer, a second semiconductor layer and a third semiconductor layer, which are laminated in this order;

a cell portion disposed in the semiconductor substrate and providing an electric part forming portion; and a periphery portion surrounding the cell portion, wherein the base substrate has a first conductive type and is made of silicon carbide, wherein the first semiconductor layer is disposed on the base substrate, has the first conductive type, and is made of silicon carbide with a low impurity concentration lower than the base substrate, wherein the second semiconductor layer has a second conductive type and is made of silicon carbide, wherein the third semiconductor layer has the first conductive type and is made of silicon carbide, wherein the periphery portion includes a trench, which penetrates the second and the third semiconductor layers, reaches the first semiconductor layer, and surrounds the cell portion so that the second and the third semiconductor layers are divided by the trench substantially, and wherein the periphery portion further includes a fourth semiconductor layer having the first conductive type and disposed on an inner wall of the trench.

2. The device according to claim 1, wherein the fourth semiconductor layer is made of an epitaxial layer.

3. The device according to claim 1, further comprising:

a buffer layer having the second conductive type; and an insulation film, wherein the trench has a width equal to or wider than twice a thickness of the fourth semiconductor layer, wherein the buffer layer is disposed on a surface of the fourth semiconductor layer, which is disposed on the bottom of the trench, and wherein the insulation film is disposed on the buffer layer so that the insulation film is disposed in the trench through the fourth semiconductor layer.

4. The device according to claim 1, wherein the trench in the periphery portion is defined as a second trench, wherein the cell portion further includes a first trench, which penetrates the second and the third semiconductor layers, and reaches the first semiconductor layer, wherein the cell portion further includes a channel layer, a fifth semiconductor layer, a gate electrode, a source electrode, and a drain electrode, wherein the channel layer has the first conductive type, and is disposed on an inner wall of the first trench, wherein the fifth semiconductor layer has the second conductive type and is disposed on the channel layer in the first trench, wherein the fifth semiconductor layer in the cell portion provides a first gate layer, and the second semiconductor layer in the cell portion provides a second gate layer, wherein the gate electrode electrically connects to at least one of the first and second gate layers, wherein the third semiconductor layer provides a source layer, and the third semiconductor layer electrically connects to the source electrode, and wherein the drain electrode is disposed on a backside of the base substrate.

5. The device according to claim 4, wherein the first trench in the cell portion has a width wider than a width of the second trench, and wherein the second trench is fully embedded with the fourth semiconductor layer.

6. The device according to claim 4, wherein the first trench in the cell portion has a width almost equal to a width of the second trench, wherein the second trench is fully embedded with both the fourth semiconductor layer and a sixth semiconductor layer having the second conductive type, and wherein the fourth semiconductor layer is disposed on the inner wall of the second trench, and the sixth semiconductor layer is disposed on the fourth semiconductor layer.

7. The device according to claim 4, wherein the second trench has a width wider than a width of the first trench.

8. A method for manufacturing a silicon carbide semiconductor device, the method comprising the steps of:

laminating a first semiconductor layer, a second semiconductor layer and a third semiconductor layer in this order on a base substrate so that a semiconductor substrate is formed;

forming a first trench in a cell portion of the semiconductor substrate to penetrate the second and the third semiconductor layers and to reach the first semiconductor layer;

forming a second trench in a periphery portion of the semiconductor substrate to penetrate the second and the third semiconductor layers and to reach the first semiconductor layer so that the second trench surrounds the cell portion to divide the second and the third semiconductor layers substantially;

forming a channel layer on an inner wall of the first trench by an epitaxial growth method;

forming a fourth semiconductor layer on an inner wall of the second trench by an epitaxial growth method together with forming the channel layer;

forming a fifth semiconductor layer on the channel layer;

forming a gate electrode to connect to at least one of first and second gate layers, which is provided by the fifth semiconductor layer in the cell portion and the second semiconductor layer in the cell portion, respectively;

forming a source electrode to connect to a source layer, which is provided by the third semiconductor layer; and forming a drain electrode on a backside of the base substrate, wherein the periphery portion surrounds the cell portion, wherein the base substrate has a first conductive type and is made of silicon carbide, wherein the first semiconductor layer is disposed on the base substrate, has the first conductive type, and is made of silicon carbide with a low impurity concentration lower than the base substrate, wherein the second semiconductor layer has a second conductive type and is made of silicon carbide, wherein the third semiconductor layer has the first conductive type and is made of silicon carbide, wherein the channel layer has the first conductive type, wherein the fourth semiconductor layer has the first conductive type, and wherein the fifth semiconductor layer has the second conductive type.

9. The method according to claim 8, wherein the second trench has a width narrower than a width of the first trench, and wherein the second trench is embedded with the fourth semiconductor layer.

10. The method according to claim 8, wherein the second trench has a width almost equal to a width of the first trench, and wherein the step of forming the fifth semiconductor layer further includes the step of forming a sixth semiconductor layer on a surface of the fourth semiconductor layer in the second trench, and wherein the sixth semiconductor layer has the second conductive type.

11. The method according to claim 8, further comprising the step of:

forming an insulation film on a surface of the fourth semiconductor layer in the second trench, wherein the second trench has a width equal to or wider than twice a thickness of the fourth semiconductor layer.

12. The method according to claim 11, wherein the second trench has a width wider than a width of the first trench.

13. The method according to claim 11, wherein the insulation film is formed by a chemical vapor deposition method.

14. The method according to claim 11, wherein the insulation film is formed by a thermal oxidation method.

15. The method according to claim 11, further comprising the step of:

forming a buffer layer on a surface portion of the fourth semiconductor layer disposed on a bottom of the second trench by an ion implantation method, wherein the step of forming the buffer layer is performed after the step of forming the fourth semiconductor layer and before the step of forming the insulation film.

* * * * *